United States Patent

Shiomi et al.

Patent Number: 5,243,199
Date of Patent: Sep. 7, 1993

[54] HIGH FREQUENCY DEVICE

[75] Inventors: Hiromu Shiomi; Yoshiki Nishibayashi; Naoji Fujimori, all of Hyogo, Japan

[73] Assignee: Sumitomo Electric Industries, Ltd., Osaka, Japan

[21] Appl. No.: 902,788

[22] Filed: Jun. 24, 1992

Related U.S. Application Data

[63] Continuation of Ser. No. 642,919, Jan. 18, 1991, abandoned.

[30] Foreign Application Priority Data

Jan. 19, 1990 [JP] Japan ................................ 2-11199

[51] Int. Cl.$^5$ ............................................. H01L 29/90
[52] U.S. Cl. ........................................ 257/77; 257/478; 257/604
[58] Field of Search .............. 357/13, 15; 257/77, 257/199, 478, 604

[56] References Cited

U.S. PATENT DOCUMENTS

| | | | |
|---|---|---|---|
| 3,628,187 | 12/1971 | De Loach, Jr. et al. | 357/13 |
| 3,673,514 | 6/1972 | Coleman, Jr. et al. | 357/13 |
| 3,882,528 | 5/1975 | Boccon-Gibod | 357/15 |
| 4,060,820 | 11/1977 | Pucel et al. | 357/13 |
| 4,839,709 | 6/1989 | Zurakowski | 357/13 |
| 4,929,986 | 5/1990 | Yoder | 357/16 |
| 4,982,243 | 1/1991 | Nakahata et al. | 357/61 |
| 5,006,914 | 4/1991 | Beetz, Jr. | 357/61 |

FOREIGN PATENT DOCUMENTS 59-208821 11/1984 Japan.
59-213126 12/1984 Japan.

OTHER PUBLICATIONS

Geis, M. W. et al., "Summary Abstract: Device Applications of Diamonds" J. Val. Sci. Tech. May/Jun. 1988 pp. 1953-1954.
Sze, S. M. *Physics of Semiconductor Devices*, 2nd ed., John Wiley, 1981, pp. 566-574.
Bazhenov, et al, "Synthetic Diamonds in Electronics" Sov. Phys. Semiconductors, Aug. 1985, pp. 829-841.
P. M. Mock, R. J. Trew, Power Generation of Millimeter-Wave Diamond Impatt Diodes, Proc. IEEE Cornell Conf. Adv. Concepts High Speed Semicond. Devices Circuits 1989 pp. 383-389 (1989).
Noise Theory for the Read Type Avalanche Diode—M. E. Hines, Senior Member IEEE—pp. 158-163.
Electronic Tuning Effects in the Read Microwave Avalanche Diode—M. Gilden, Member IEEE, and M. E. Hines Senior Member IEEE—pp. 169-175.
A Small-Signal Theory of Avalanche Noise in Impatt Diodes—Herman K. Gummel and James L. Blue pp. 560-572.

*Primary Examiner*—Sara W. Crane
*Attorney, Agent, or Firm*—Cushman, Darby & Cushman

[57] ABSTRACT

Improvement of a high frequency device having metal layers, active semiconductor layers and other semiconductor layers which make use of carrier avalanche or carrier injection induced by a reverse bias voltage for amplification or oscillation of high frequency waves. The active semiconductor layers are made of semiconductor diamond. High heat conductivity and high insulation breakdown voltage of diamond heighten the output power of oscillation or amplification.

4 Claims, 3 Drawing Sheets

HIGH FREQUENCY DEVICE

This is a continuation of application Ser. No. 07/642,919, filed on Jan. 18, 1991, which was abandoned upon the filling hereof.

FIELD OF THE INVENTION

This invention relates to a high frequency device for amplification or oscillation of high power and high frequency waves.

BACKGROUND OF THE INVENTION

There are an IMPATT (impact ionization avalanche and transit time device) diode used and a BARITT (barrier inject transit time device) diode as high frequency devices which amplify high frequency waves into high power waves or generate an oscillation of high frequency waves with high power.

FIG. 1 shows a typical example of IMPATT diodes. An $n^+$-type (or $p^+$-type) semiconductor layer, a less doped semiconductor layer ($v$), an n-type (or p-type) semiconductor layer and a $p^+$-type (or $n^+$-type) semiconductor layer make strata in this order in the diode. Electrodes are fitted on both ends ($n^+$-type and $p^+$-type of layers) of the strata. A reverse bias voltage is applied to the diode. Namely the electrode of the $n^+$-type layer is connected to the positive terminal of an electric power source, and the electrode of the $P^+$-type layer is connected to the negative terminal of the power source. This reverse bias voltage induces a carrier avalanche in the less doped semiconductor layer ($v$) near the n-type layer. The electrons generated by the avalanche run through the less doped semiconductor layer ($v$) to the $n^+$-type layer with saturated velocity. This phenomenon induces negative resistance in the diode. The occurrence of negative resistance enables the diode to generate microwave oscillation. The diode of FIG. 1 is a typical IMPATT diode which has a pn-junction. But there is another type of IMPATT diode in which the pn-junction is replaced by a Schottoky junction between a metal and a semiconductor.

A BARITT diode has a structure in which a metal layer, a p-type layer (or n-type layer) of semiconductors and a metal layer make strata in this order (FIG. 4). One junction between the metal and one semiconductor layer is a Schottoky junction. In the same way as the IMPATT diodes, when a reverse bias voltage is applied to the diode, majority carriers are injected to the semiconductor layer. The action of the majority carriers generates microwave oscillation. There is another kind of BARITT diode which has a pn-junction instead of the Schottoky junction between a metal and a semiconductor.

The semiconductor material of both high frequency devices is silicon or gallium arsenide. Other semiconductor material has not been used as the material of high frequency devices so far.

In the high frequency devices abovementioned, much heat is generated in the semiconductor region in the action of microwave oscillation. To keep the microwave oscillation stable, the heat incessantly generated in the action of oscillation should be effectively emitted out of the diode. Various kinds of cooling devices have been invented in order to eliminate the heat from the diodes. A typical method for cooling is fitting the high frequency device to a heatsink with large heat capacity. In the structure the heat quickly conducts in the heatsink and emanates from the surfaces of the heatsink into the air.

However silicon and gallium arsenide have poor heat conductivity. In the conventional high frequency devices made of silicon or gallium arsenide, the heat generated by the microwave oscillation slowly conducts in the semiconductor and does not attain to the heatsink so fast that the semiconductor region is kept cool enough. Due to the poor heat conductivity of silicon or gallium arsenide, if a large amount of electric current is applied to them, the conventional high frequency device will be broken down by overheating. To avoid the heat-induced breakdown, the input current shall be restricted to a low level. Because of the low input power, the output power of microwave oscillation is naturally low in the devices of silicon or gallium arsenide.

There is another problem regarding the heat dissipation. The junction between the device and the heatsink is accompanied with large heat resistance. Although the heatsink has high heat conductivity, the heat generated by microwave oscillation is not effectively dissipated because of the low conductivity of semiconductors Si or GaAs and the high heat resistance at the interface between the device and the heatsink. Thus fitting the heatsink to the device cannot solve the problem that poor heat dissipation restricts the output power of microwave oscillation to low level.

Besides poor heat conductivity, in the semiconductors, silicon or gallium arsenide, the output power and the maximum oscillation frequency of the devices are restricted by the insulation breakdown voltage and the carrier mobility which are inherently determined by the properties of the semiconductors.

Both silicon and gallium arsenide have a low insulation breakdown voltage. High reverse bias voltage cannot be applied to silicon or gallium arsenide devices because of the low insulation breakdown voltage. Thus the silicon or gallium arsenide devices cannot accomplish high output power of microwave oscillation, because the output power is in proportion to the input voltage.

The saturation mobilities of silicon and gallium arsenide are about $1 \times 10^7$ cm/sec, which is not fast enough to generate high power oscillation of hundreds of gigaherz (GHz). Low saturation mobility is the most fatal drawback of silicon or gallium arsenide semiconductor device.

The purpose of this invention is to solve the difficulties and to provide a high power and high frequency device which amplifies high frequency signals or generates high frequency oscillation. Another purpose of the invention is to provide a high power and high frequency device which effectively works under high temperature environment.

SUMMARY OF THE INVENTION

A high frequency device of this invention is a device having metal layers, active semiconductor layers and other semiconductor layers, which makes use of carrier avalanche for amplification or oscillation of high frequency waves and in which the active semiconductor layers are made of semiconductor diamond. Preferably the high frequency device comprises a $p^+$-type diamond layer, an n-type diamond layer, a less-doped (n-type) diamond layer and an $n^+$-type diamond layer being made in strata in this order, an electrode fitted on the $p^+$-type diamond layer, and an electrode fitted on the n+-type diamond layer. This corresponds to the device shown by FIG. 1.

Definitions of the type of conductivity are now described: "n-type" means the semiconductor in which electrons are majority carriers and holes are minority carriers. "p-type" means the semiconductor in which holes are majority carriers and electrons are minority carriers. "p+-type" means the semiconductor in which the density of holes is bigger than the density of holes in other "p-type" regions. "n+-type" means the semiconductor in which the density of electrons is bigger than the density of electrons in other "n-type" regions. Thus the conductivity of p+-type or an n+-type region is higher than that of other p-type or n-type regions. The less-doped n-type (designated by "$\nu$") means non-doped or less-doped region. In this region ($\nu$), the majority carriers are electrons but the density of them is very small. Thus the conductivity is very small. The electrodes contact to the p+-type diamond layer or the n+-type diamond layer in an "ohmic contact" manner. The "ohmic contact" means low and symmetric resistivity regarding the directions of current.

Another high frequency device of this invention comprises an n+-type diamond layer, a p-type diamond layer, a thick less-doped (p-type) diamond layer and a p+-type diamond layer being made in strata in this order, an electrode fitted on the n+-type diamond layer and an electrode fitted on the p+-type diamond layer. These are diamond IMPATT diodes. Reverse bias voltage shall be applied to the diode by an electric source for oscillating microwaves.

Of course the high frequency device of this invention can be fabricated as a BARITT diode shown in FIG. 4. Two electrode sandwiches a less doped diamond semiconductor layer. A contact between one electrode and the diamond may be "ohmic" one, but another contact between the other electrode and the diamond must be "Schottoky" one. "Schottoky contact" means a contact having a Schottoky barrier which corresponds to the difference of work function between the metal and the semiconductor. The Schottoky contact rectifies a current like a pn-junction. Reverse bias voltage shall be applied to the diode by an electric source also. Over the Schottoky barrier, carriers are injected into the semiconductor. If the semiconductor is a p-type, holes are injected into the semiconductor layer. If the semiconductor is an n-type, electrons are injected into the semiconductor layer. Thus the reverse bias voltage injects the majority carrier into the semiconductor. The carriers drift with saturated mobility. The delay of the drift generates negative resistance.

The semiconductor layers shown in FIG. 1 or FIG. 4 are active layers. These active layers require a substrate on which they are deposited. The substrate is preferably a natural diamond plate or an artificially synthesized diamond plate for effective heat emission and lattice matching. The substrate is preferably an insulating one. But if the first layer is an n-type (or p-type) semiconductor diamond, the p-type (or n-type) diamond substrate is available, because the pn-junction between the first layer and the substrate isolates the substrate from the active layers. A p-type diamond layer is obtained by doping a p-type dopant, e.g. boron (B). An n-type diamond layer is obtained by doping an n-type dopant, e.g. phosphor (P).

The function of the high frequency devices (IMPATT diode) is now described. Reverse bias voltage is applied to the diodes having diamond active layers. The principle of function of oscillation or amplification is common with the diodes of silicon or gallium arsenide. In the case of IMPATT diode, strong voltage applied between the p+ layer and the n layer induces a carrier avalanche which excites many electrons and holes. The holes rapidly flow into the p+ layer and vanish by recombing with electrons which are supplied by the external source. The electrons drift with a saturated mobility in the less doped (n-type) layer ($\nu$). A negative resistance occurs by the delay of the carrier avalanche and the delay of the drift of carriers. The negative resistance enables the diode to generate microwave oscillation or amplify microwave signals.

In the case of the diode having a Schottky junction instead of a pn-junction, a strong voltage applied between the metal and the semiconductor diamond induces a carrier avalanche near the interface like the IMPATT diode of FIG. 1. Similarly the carrier avalanche enables the diode to generate microwave oscillation or amplify microwave signals.

The principle of oscillation or amplification of the diamond diode is same with that of the silicon or gallium arsenide diode.

"Microwave" is used in rather an ambiguous manner. It often means electromagnetic waves whose wave length is shorter than about one meter. Thus the frequency is bigger than 0.3 GHz. But another definition of microwave is the electromagnetic waves whose frequency is bigger than 1 GHz but lower than 1000 GHz. Thus microwave is not properly defined. In this invention, high frequency means the waves whose frequency is higher than 1 GHz. But in this description, microwave is often used as a simplified expression of high frequency wave.

Then the properties of the device of this invention are explained in comparison with the silicon and gallium arsenide diodes.

Diamond has a wide band gap of 5.5 eV (electron volt). The band gaps of silicon and gallium arsenide are 1.1 eV and 1.4 eV respectively. Because of the wide band gap, the temperature region corresponding to the intrinsic semiconductor does not exist below 1400° C., at which diamond is still stable. For this reason, when the temperature of the device is raised, the number of carriers does not increase in the less-doped diamond layer, because thermal excitation cannot create hole-electron pairs over the wide band gap. Then even if the diamond device is under hot environment, the resistivity of the less doped layer does not decrease. Because of the high resistivity of the less doped ($\nu$) layer, the carrier avalanche is induced also at high temperature by the reverse bias voltage. Then even under hot environment the diode of this invention works well as an amplifier or an oscillator of microwave.

Further, diamond is stable against chemical reactions. Accordingly the devices of this invention works under hot environment in chemical atmosphere. The devices are protected against heat and corrosion.

The heat conductivity of diamond is 20 W/cm K, which is ten times larger than that of silicon. Diamond excels in heat emission. Further advantages of diamond are large carrier mobilities (electron mobility: 200 cm$^2$/V sec, hole mobility: 2100 cm$^2$/V sec at 300K), large saturated electron mobility ($2 \times 10^7$ cm/sec), low dielectric constant (K=5.5) and large insulation breakdown electric field (E=$5 \times 10^6$ V/cm). These advantages of diamond enables us to fabricate high power and high frequency devices of diamond.

The reasons why the device brings about high output power are now explained. The output power of oscillation of microwave devices in high frequency region (higher than 1 GHz) is in proportion to the square of the product of the insulation breakdown voltage and the saturated electron mobility. The insulation breakdown voltage of diamond is about ten times larger than that of silicon or gallium arsenide. The saturated electron mobility of diamond is two times larger than that of silicon or gallium arsenide. Thus the output power of diamond devices shall be about 400 times larger than that of silicon or gallium arsenide in high frequency region.

The output power of oscillation of microwave devices in low frequency region (lower than 1 GHz) is in proportion to the heat conductivity of the active layers of semiconductors. The heat conductivity of diamond is about ten times larger than that of silicon or gallium arsenide. Thus the output power of the diamond device is ten times larger than that of silicon or gallium arsenide devices.

Furthermore, unlike silicon or gallium arsenide, diamond without impurity is an insulator. Conveniently the active layers can be electrically isolated from the substrate if the diamond substrate is non-doped. In the case of silicon diode, another pn-junction is required to isolate the active layer from the conducting substrate.

Because the technology for fabricating diamond thin films of good quality had not been established until recently, there had been no high frequency device having diamond active layers in the world. However the technology for fabricating diamond films has established recently by the efforts of many researchers including the applicants. Diamond layers are synthesized on a diamond-growing substrate from material gas by chemical vapor phase deposition methods (CVD methods).

Various methods for making diamond thin films are proposed so far;

(1) A method by activating the material gas by electric discharge between electrodes induced by an electric field of direct current or an alternating current.
(2) A method by activating the material gas by thermal electrons emitted from a heated electron-emitting material.
(3) A method by bombarding the surface of the substrate with ions and activating the substrate and the material gas near the substrate.
(4) A method by exciting the material gas by laser beam or ultraviolet beam.
(5) A method by burning the material gas.

All methods for making diamond films are available to the high frequency devices of this invention.

The material gas for fabricating diamond thin films comprises hydrogen gas, compound gas including carbon, and dopant gas. Besides them the material gas may include another compound gas containing oxygen and inertia gas.

The compound gases including carbon are for example,
(1) paraffin hydrocarbons . . . methane, ethane, propane, butane, etc.
(2) olefin hydrocarbons . . . ethylene, propylene, butylene, etc.
(3) hydrocarbons of acetylenes series . . . acetylene, aniline, etc.
(4) diolefin hydrocarbons . . . butadiene, etc.
(5) alicyclic hydrocarbons . . . cyclopropane, cyclobutane, cyclopentane, cyclohexane, etc.
(6) aromatic hydrocarbons . . . cyclobutadiene, benzen, toluene, xylene, naphthalene, etc.
(7) ketones . . . acetone, diethylketone, benzophenone, etc.
(8) alcohols . . . methanol, ethanol, etc.
(9) amines . . . trimethylamine, triethylamine, etc.
(10) carbon dioxide gas ($CO_2$)
(11) carbon monoxide gas (CO)

Regarding the compound gases including carbon, the material gas used in the invention includes either one kind of the gases or several kinds of the gases. Hydrocarbons contained in the material gas are able to be replaced by the materials including only carbon, e.g. graphite, coal, coke.

The compound gases including oxygen are oxygen, water, carbon monoxide, carbon dioxide, hydrogen peroxide, etc.

The inertia gases are argon (Ar), helium (He), neon (Ne), krypton (kr), xenon (Xe), radon (Ra). Dopants are simple substances or compounds including boron (B), lithium (Li), nitrogen (N), phosphor (P), sulphur (S), chlorine (Cl), arsenide (As) or selenium (Se).

Impurities are easily doped into a growing diamond crystal layer by mixing dopant into the material gas. The resistivities of the diamond layers are controlled by the amount of dopants mixed into the materials gas. An insulating diamond layer can be grown by the material gas without impurity or by the material gas having a proper impurity.

The region where the carrier avalanche occurs is the depletion layer built by a pin-junction or a Schottoky junction.

The Schottoky electrode is made of any metals which form a Schottoky junction between diamond and metal. For example, Au, Pt, Cu, Mo, W, Al, Ni, Fe, Co, Mn or carbides of these metals is used to fabricate a Schottoky electrode.

DESCRIPTION OF THE PREFERRED EMBODIMENTS

Embodiment 1

Figure 1:
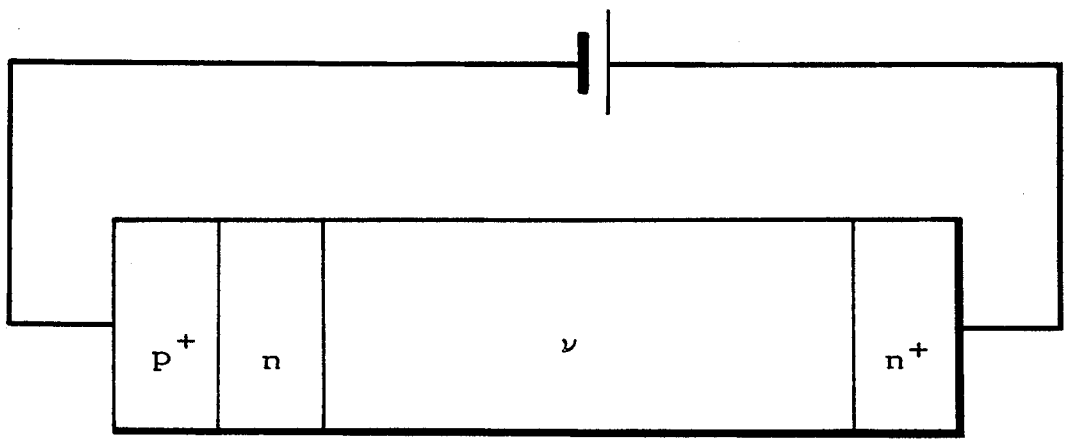
FIG. 1 is a simplified sectional view of an IMPATT diode.
Figure 2:
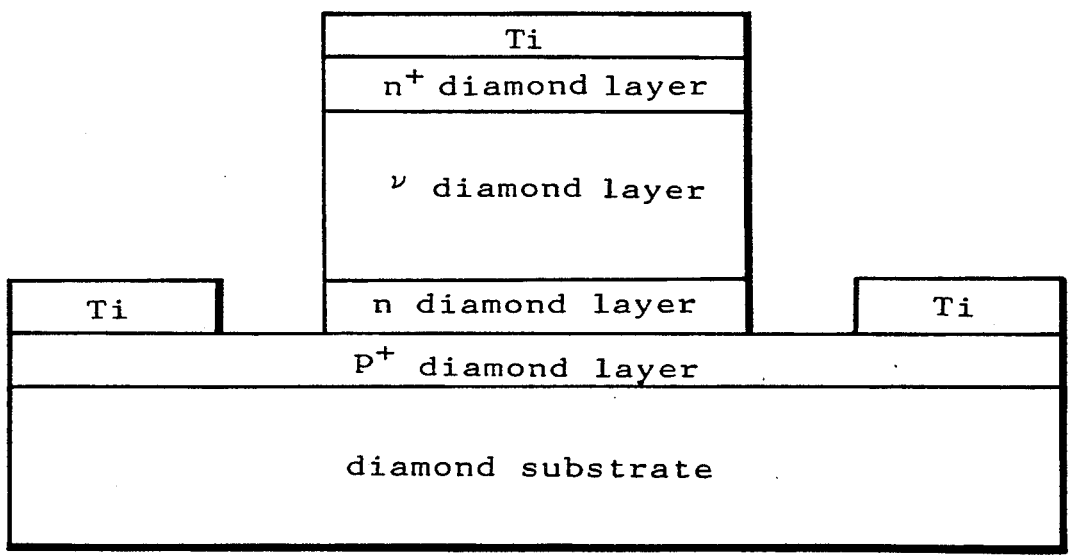
FIG. 2 is a schematical sectional view of the IMPATT diode of thus invention.

An IMPATT diode shown in FIG. 2 is fabricated according to the invention. In the diode, a $p^+$-type diamond layer, an n-type diamond layer, a less doped (n-type) diamond layer ($v$) and a $n^+$-type diamond are deposited on a diamond substrate in succession. Titanium (Ti) electrodes contact on the $n^+$-type diamond layer and the $p^+$-type diamond layer.

Processes of fabrication are now explained by referring to FIG. 3.

Figure 3A:
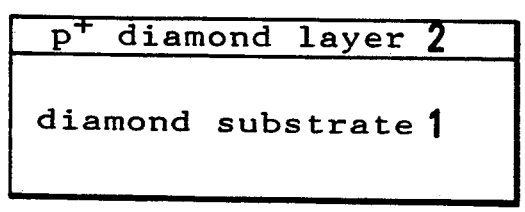
FIGS. 3(a)-3(e) are sectional views showing the steps of fabrication of the IMPATT diode of this invention.

(1) A $I_b$ type of artificially synthesized diamond single crystal is prepared to a substrate (1). The size of the substrate is 3 mm × 2 mm × 1 mm. The conductivity is $10^{12}$ Ω cm. The wide surface (3 mm × 2 mm) is parallel with the (100) plane of the crystal. A $P^+$-type diamond layer (2) highly doped with B (boron) is deposited on the (100) plane of the substrate by the microwave plasma CVD (chemical vapor phase deposition) method. The thickness of the P+-type diamond layer (2) is 10 μm. FIG. 3(a) shows the substrate after the deposition.

The conditions of the microwave plasma CVD are as follows;

| microwave power | 300 W |
| pressure in the reaction | 40 Torr (5330 Pa) |
| material gas | $CH_4$ (6%), $B_2H_6$ (0.001%) |
| | $H_2$ (all the remainder) |

Figure 3B:
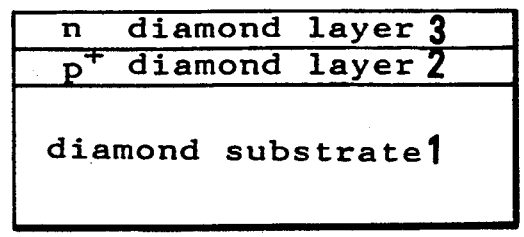

(2) An n-type diamond (3) doped with phosphorus (P) is deposited on the highly doped P+-type diamond layer (2) by the microwave plasma CVD method. FIG. 3(b) shows the substrate after this process. The thickness of the n-type diamond layer (3) is 2 μm.

The conditions of the microwave plasma CVD method are as follows;

| microwave power | 300 W |
| pressure in the reaction | 40 Torr (5330 Pa) |
| material gas | $CH_4$ (6%), $PH_3$ (0.00008%) |
| | $H_2$ (all the remainder) |

Figure 3C:
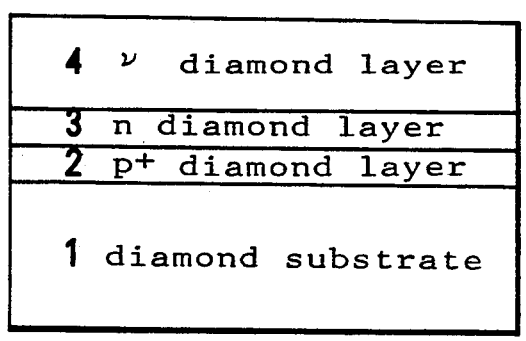

(3) A less doped n-type layer (designated by ν) (4) doped with phosphorus (P) is deposited on the n-type diamond layer (3) by the microwave plasma CVD method (FIG. 3(c)). The thickness of the less doped layer (4) is 4 μm.

The conditions of the microwave plasma CVD method are as follows;

| microwave power | 300 W |
| pressure in the reaction | 40 Torr (5330 Pa) |
| material gas | $CH_4$ (6%), $PH_3$ (0.00001%) |
| | $H_2$ (all the remainder) |

(4) An n+-type diamond layer (5) highly doped with phosphor (P) is deposited on the less doped layer (4) by the microwave plasma CVD method. The thickness of the n+-type diamond layer (5) is 4 μm.

The conditions of the microwave plasma CVD method are as follows;

| microwave power | 300 W |
| pressure in the reaction | 40 Torr (5330 Pa) |
| material gas | $CH_4$ (6%), $PH_3$ (0.001%) |
| | $H_2$ (all the remainder) |

Figure 3D:
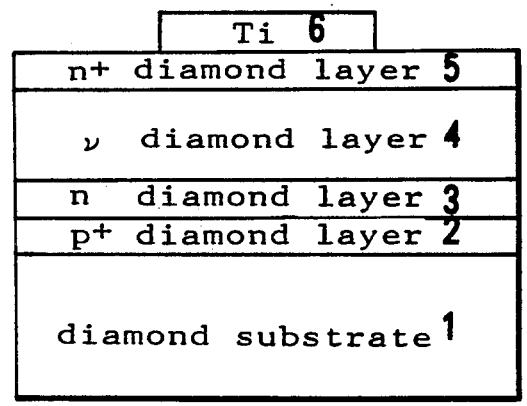

Then titanium (Ti) is evaporated on a part of the n+-type diamond layer (5) as an ohmic electrode (6) (FIG. 3(d)).

(5) The diamond layers are etched by an oxygen plasma etching method until the P+-type diamond layer (2) is exposed. The part covered with the titanium electrode (6) is left unetched.

The conditions of the oxygen plasma etching are;

| oscillation output power of R.F. wave | 200 W |
| pressure in etching | 0.05 Torr (6.6 Pa) |

Figure 3E:
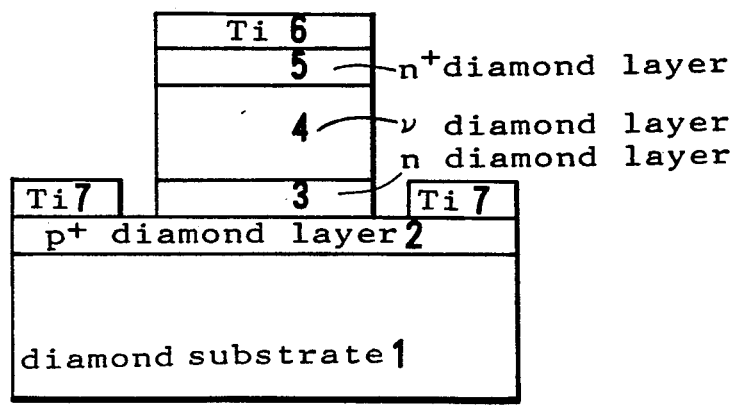

Then titanium deposited on the P+-type diamond layer (2) as ohmic electrodes (7) (FIG. 3(e)).

When the high frequency device fabricated by the process is reversely biased by a power source, microwave oscillation of 9.7 GHz with 1 kW is obtained.

EMBODIMENT 2

Another high frequency diamond device shown by FIG. 3(e) is also fabricated. The structure is same with the embodiment 1. But the thickness and the impurity density are changed for raising oscillation frequency. The thickness of the n-type diamond layer (3) is now 0.2 μm (tenth of the thickness in the embodiment 1). The thickness of less doped layer (4) is now 0.6 μm (about sixth of the thickness in the embodiment 1). Amount of dopant (P) in the gas is raised to 90 times larger than that of the embodiment 1. Namely $PH_3$ is 0.0072% of the material gas for depositing the n-type diamond layer (3) and $PH_3$ is 0.0009% of the material gas for depositing the less doped layer (4). The purpose of thinning the active layer and raising the impurity density is to heighten the oscillation frequency. The device fabricated in the manners generates microwave oscillation of 100 GHz with 50 W in continuous mode. The result demonstrates the advantage of this invention eloquently. There is no other semiconductor devices (or solid state devices) except for IMPATT diodes which can generate the microwave oscillation of 100 GHz. However even a best silicon IMPATT diode generates at best 1 W of oscillation at 100 GHz in continuous mode.

The high output power of oscillation in the device of the invention is nearly equal to that of a bulky, big magnetron.

EMBODIMENT 3

Figure 4:
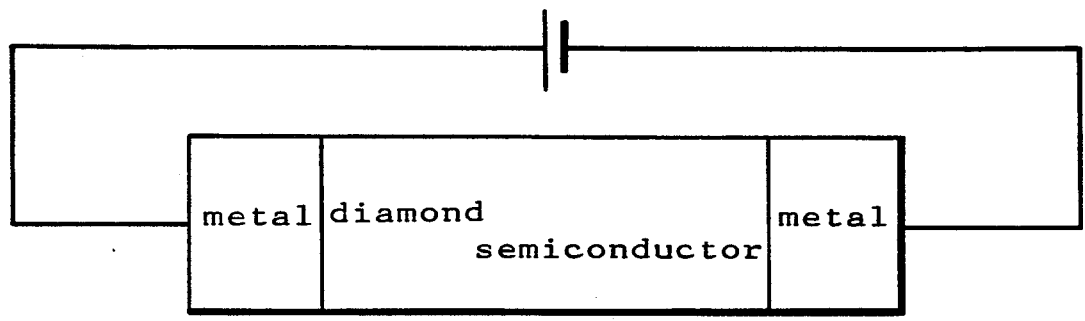
FIG. 4 is a simplified sectional view of a BARITT diode using a Schottoky junction.
Figure 5:
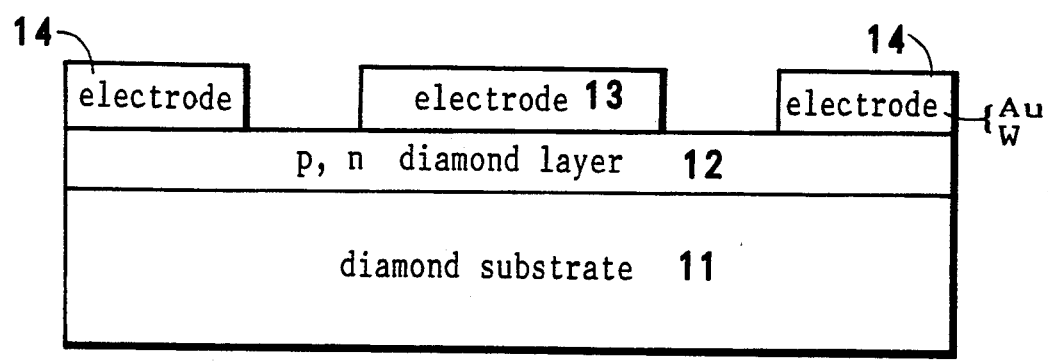
FIG. 5 is a schematical sectional view of a BARITT diode using a Schottoky junction of this invention.

Another high frequency device (BARITT diode) shown in FIG. 4 is fabricated according to this invention. Practical structure is shown by FIG. 5. This device comprises a diamond substrate (11), an n-type diamond layer (12), electrodes (13) and (14).

A diamond substrate of $I_b$ type synthesized single crystal is prepared. The size is 3 mm×2 mm×1 mm. Resistivity is $10^{12}$ Ω cm. The largest surface is a (100) plane of crystal structure. A p-type diamond layer (12) doped with boron (B) is deposited on the diamond substrate (11) by the microwave plasma CVD method. The layer thickness is 6 μm.

The condition of the microwave plasma CVD are;

| microwave power | 300 W |
| pressure in the reaction | 40 Torr (5330 Pa) |
| material gas | $CH_4$ (6%), $PH_3$ (0.00005%) |
| | $H_2$ (all the remainder) |

Gold (Au) is deposited on the P-type diamond layer (12) as electrodes (13) and (14). The Au electrodes are Schottoky electrodes which rectify a current at the junctions. This device also generates microwave oscillation with noise lower than that of embodiment 1.

Embodiment 4

Another high frequency device shown in FIG. 4 and FIG. 5 is fabricated. The diamond substrate is same with that of embodiment 1. But the active layer is different in thickness and type of conductivity. Now an n-type diamond layer (12) doped with phosphorus (P) is deposited on the (100) surface of the substrate (11) by the microwave plasma CVD method.

The conditions of microwave plasma CVD are;

| | |
|---|---|
| microwave power | 300 W |
| pressure in the reaction | 40 Torr (5330 Pa) |
| material gas | $CH_4$ (6%), $B_2H_6$ (0.00005%) |
| | $H_2$ (all the remainder) |

Tungsten (W) is sputtered on the p-type diamond layer (12) as electrodes (13) and (14). The W electrodes fit on the p-type diamond layer (12) as Schottoky electrodes.

This device generates microwave oscillation of 20 GHz with noise lower than that of embodiment 1.

The high frequency device of this invention has the following advantages.

(1) This device can generate microwave oscillation or amplify microwave signals of high frequency into high output power. This device can be used as a microwave oscillator or a microwave amplifier in a medium of communication or a radar. A large magnetron may be replaced by the device of the invention.

(2) This device is also available under harsh environment e.g. in space; in a space rocket, a space station or a satellite, because it is proven for use in cold, hot or vacuum.

(3) High heat conductivity of diamond enables us to fabricate the device into a highly integrated circuit.

What is claimed is;

1. A high frequency device comprising:

a $p^+$-type diamond layer;

a first n-type diamond layer, deposited on the $p^+$-type diamond layer, and having a thickness of one of substantially 0.2 $\mu m$ and 2 $\mu m$;

a second n-type diamond layer, less-doped than the first n-type diamond layer, deposited on the first n-type diamond layer, and having a thickness of substantially 0.6 $\mu m$ when the thickness of the first n-type diamond layer is substantially 0.2 $\mu m$ and a thickness of substantially 4 $\mu m$ when the thickness of the first n-type diamond layer is substantially 2 $\mu m$;

a third $n^+$-type diamond layer deposited on the second less-doped n-type diamond layer;

a first electrode disposed on the $p^+$-type diamond layer; and a second electrode disposed on the third $n^+$-type diamond layer, wherein reverse bias voltage induces a carrier avalanche in the high frequency device to one of amplify and oscillate high frequency waves.

2. A high frequency device comprising:

an insulating diamond substrate;

a $p^+$-type diamond layer deposited on the diamond substrate;

a first n-type diamond layer, deposited on the $p^+$-type diamond layer, and having a thickness of one of substantially 0.2 $\mu m$ and 2 $\mu m$;

a second n-type diamond layer, less-doped than the first n-type diamond layer, deposited on the first n-type diamond layer, and having a thickness of substantially 0.6 $\mu m$ when the thickness of the first n-type diamond layer is substantially 0.2 $\mu m$ and a thickness of substantially 4 $\mu m$ when the thickness of the first n-type diamond layer is substantially 2 $\mu m$;

a third $n^+$-type diamond layer deposited on the second less doped n-type diamond layer;

a first electrode disposed on the $p^+$-type diamond layer; and a second electrode disposed on the third $n^+$-type diamond layer, wherein reverse bias voltage induces a carrier avalanche in the high frequency device to one of amplify and oscillate high frequency waves.

3. A high frequency device comprising:

an $n^+$-type diamond layer;

a first p-type diamond layer, deposited in the $n^+$-type diamond layer, and having a thickness of one of substantially 0.2 $\mu m$ and 2 $\mu m$;

a second p-type diamond layer, less-doped than the first p-type diamond layer, deposited on the first p-type diamond layer, and having a thickness of substantially 0.6 $\mu m$ when the thickness of the first p-type diamond layer is substantially 0.2 $\mu m$ and a thickness of substantially 4 $\mu m$ when the thickness of the first p-type diamond layer is substantially 2 $\mu m$;

a third $p^+$-type diamond layer deposited on the second less-doped p-type diamond layer;

a first electrode disposed on the $n^+$-type diamond layer; and a second electrode disposed on the third $p^+$-type diamond layer, wherein reverse bias voltage induces a carrier avalanche in the high frequency device to one of amplify and oscillate high frequency waves.

4. A high frequency device comprising:

an insulating diamond substrate;

a $n^+$-type diamond layer deposited on the diamond substrate;

a first p-type diamond layer, deposited on the $n^+$-type diamond layer, and having a thickness of one of substantially 0.2 $\mu m$ and 2 $\mu m$;

a second p-type diamond layer, less-doped than the first p-type diamond layer, deposited on the first p-type layer, and having a thickness of substantially 0.6 $\mu m$ when the thickness of the first p-type diamond layer is substantially 0.2 $\mu m$ and a thickness of substantially 4 $\mu m$ when the thickness of the first p-type diamond layer is substantially 2 $\mu m$;

a third $p^+$-type diamond layer deposited on the second less-doped p-type diamond layer;

a first electrode disposed on the $n^+$-type diamond layer; and a second electrode disposed on the third $p^+$-type diamond layer, wherein reverse bias voltage induces a carrier avalanche in the high frequency device to one of amplify and oscillate high frequency waves.

* * * * *